United States Patent
Reis et al.

Patent Number: 5,795,492
Date of Patent: Aug. 18, 1998

[54] ETCHING METALS USING CHLORINE GAS AND HYDROCHLORIC GAS IN DE-IONIZED WATER

[75] Inventors: Kenneth Reis, San Antonio; Allen Page, Helotes, both of Tex.

[73] Assignee: VLSI Technology, Inc., San Jose, Calif.

[21] Appl. No.: 846,833

[22] Filed: Apr. 30, 1997

[51] Int. Cl.$^6$ ................................ H01L 21/306
[52] U.S. Cl. ..................... 216/57; 216/100; 216/108
[58] Field of Search ................. 216/57, 100, 108; 134/1.3, 1

[56] References Cited

U.S. PATENT DOCUMENTS

| | | | |
|---|---|---|---|
| 4,472,236 | 9/1984 | Tanaka et al. | 216/108 |
| 4,832,779 | 5/1989 | Fisher et al. | 216/100 |
| 5,674,410 | 10/1997 | Nakajima et al. | 134/1.3 |

*Primary Examiner*—R. Bruce Breneman
*Assistant Examiner*—Thomas W. Weingart
*Attorney, Agent, or Firm*—Douglas L. Weller

[57] ABSTRACT

A metal, such as Platinum, is stripped from a wafer during processing of an integrated circuit. The wafer, typically within a cassette of wafers, is submerged in de-ionized water. The de-ionized water is, for example, held within a container made of quartz. Optimally, the de-ionized water is heated, for example, to a temperature of 80 degrees Centigrade. Chlorine gas and hydrochloric acid gas are bubbled into the de-ionized water to oxidize the metal.

12 Claims, 3 Drawing Sheets

ETCHING METALS USING CHLORINE GAS AND HYDROCHLORIC GAS IN DE-IONIZED WATER

BACKGROUND

The present invention concerns processing of integrated circuits and pertains particularly to etching metals using chlorine gas and hydrochloric gas in de-ionized water.

During the processing of integrated circuits after a metal layer is deposited and patterned, an etch is used to remove the excess metal. This is done, for example using a bath of aqua regia, which is formed from the combination of nitric acid and hydrochloric acid. For example, aqua regia is used to strip excess Platinum (Pt) during integrated circuit processing. The chemical reaction to form the aqua regia is given in Equation 1 below:

$$3HCl+HNO_3 \rightarrow ClNO+H_2O+Cl_2(g) \qquad \text{Equation 1}$$

The Chlorine Nitrous Oxide (ClNO) is a byproduct and the free chlorine gas is used to oxidize the Platinum. The chemical reaction for the oxidation of Platinum is given in Equation 2 below:

$$Pt+6Cl^{-1} \rightarrow [PtCl_6]^{2-} \qquad \text{Equation 2}$$

Generally when using aqua regia to oxidize Platinum, excess hydrochloric acid is used to avoid the precipitation of $H_2PtCl_6 \cdot 6H_2O$. The use of excess hydrochloric acid increases the cost of the chemical reaction and presents a disposal problem.

SUMMARY OF THE INVENTION

In accordance with the preferred embodiment of the present invention, a metal, such as Platinum, is stripped from a wafer during processing of an integrated circuit. The wafer, typically within a cassette of wafers, is submerged in de-ionized water. The de-ionized water is, for example, held within a container made of quartz. Optimally, the de-ionized water is heated, for example, to a temperature of 80 degrees Centigrade. Chlorine gas and hydrochloric acid gas are bubbled into the de-ionized water to oxidize the metal.

After the metal has been oxidized, the de-ionized water is diluted. Once the dilution is complete the wafer is removed from the diluted de-ionized water.

The use of Chlorine gas and hydrochloric gas to perform the metal etch allows for tighter control of the chemical composition of the bath. This reduces the amount of chemicals needed and the amount and concentration of chemical material left over after processing. Thus there is less toxic waste which simplifies the task of disposing of materials left over from processing.

Additionally, the chemicals used in the present invention are readily available and inexpensive. Most semiconductor fabrication laboratories produce their own highly pure de-ionized water. Additionally, high purity gases are readily available.

DESCRIPTION OF THE PREFERRED EMBODIMENT

Figure 1:
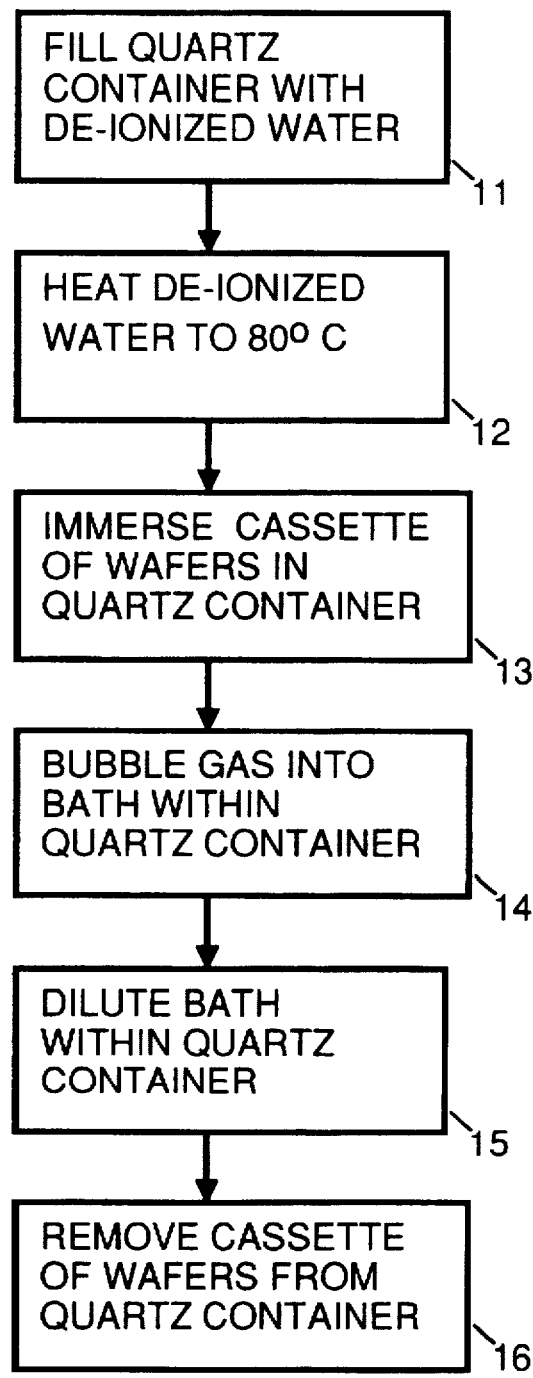
FIG. 1 shows a flowchart for etching metal during integrated circuit processing in accordance with a preferred embodiment of the present invention.
Figure 2:
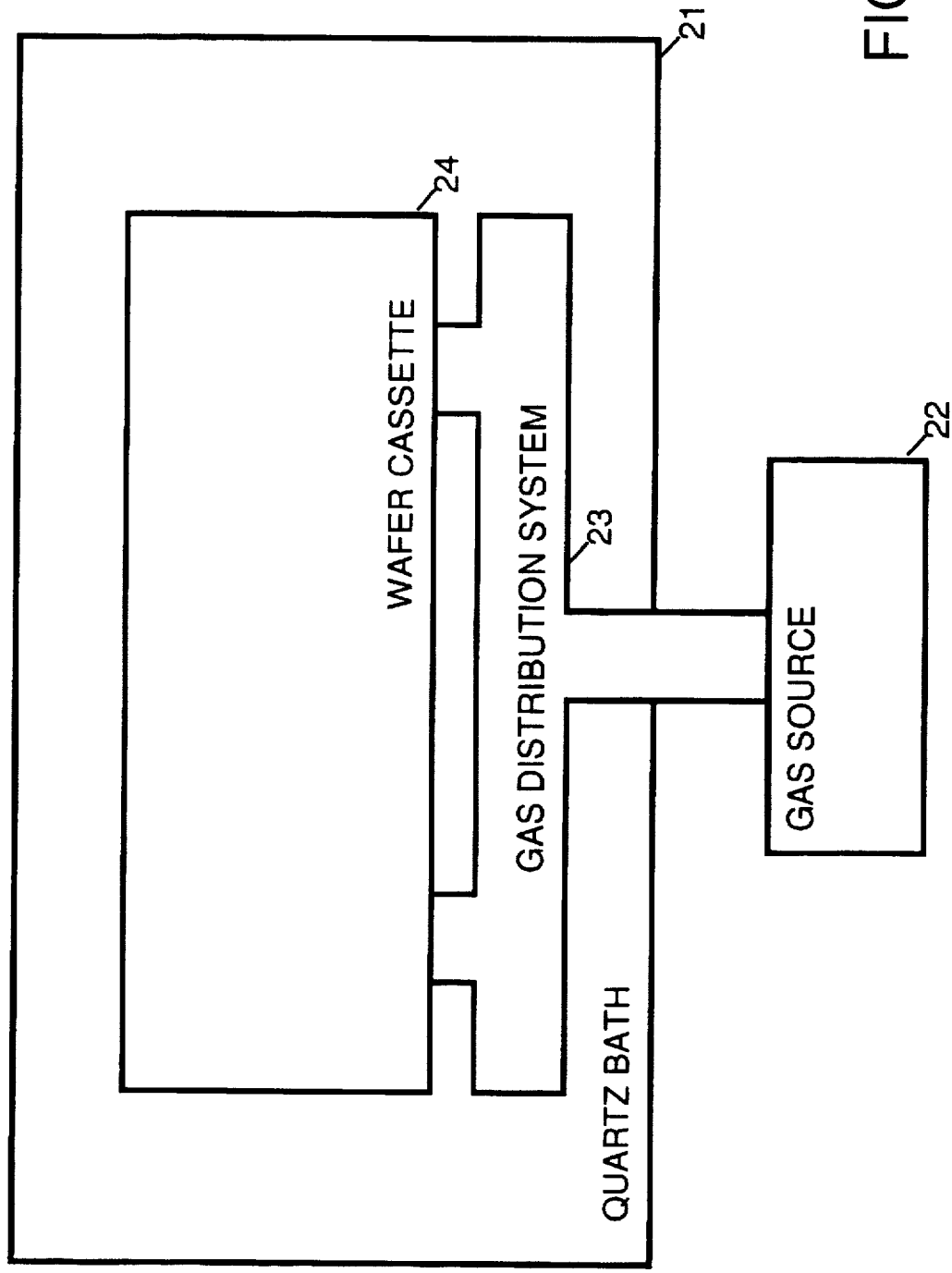
FIG. 2 is a simplified block diagram of equipment used to etch metal during integrated circuit processing in accordance with a preferred embodiment of the present invention.

FIG. 1 shows a flowchart which describes a process for etching metal during integrated circuit processing. In a step 11 a container is filled with de-ionized water. For example, FIG. 2 shows a container 21. Container 21 is, for example, made of quartz. The optimum dimensions of container 21 will vary depending upon the number and size of the wafers to be processed.

In a step 12, shown in FIG. 1, the de-ionized water within container 21 is heated to 80 degrees Centigrade. In a step 13, a wafer cassette 24 is immersed within the de-ionized water within container 21.

Figure 3:
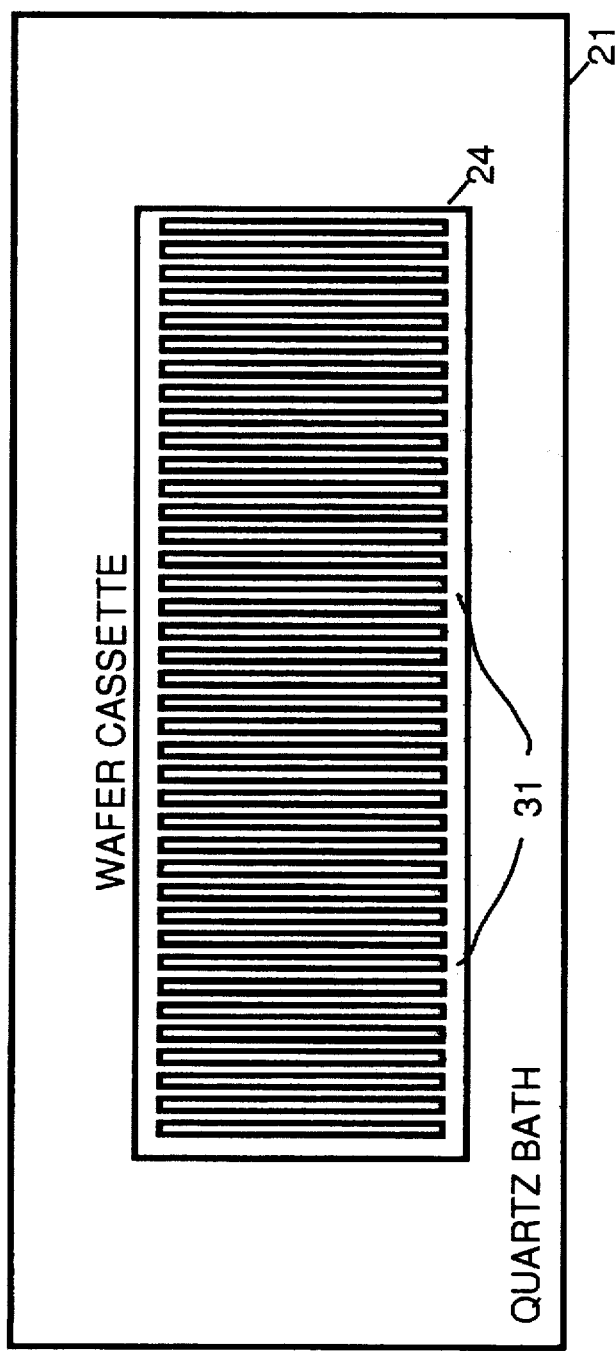
FIG. 3 is a top view simplified block diagram of equipment used to etch metal during integrated circuit processing in accordance with a preferred embodiment of the present invention.

FIG. 3 shows a top view of wafer cassette 24 within container 21. Wafers 31 within wafer cassette 24 are, for example, 8 inches in diameter. Alternatively, the wafers may be of any size or shape currently used for processing integrated circuits. While a single wafer cassette 24 is shown holding thirty-eight wafers, container 21 can be designed to hold any size and any number of wafer cassettes.

In a step 14, shown in FIG. 1, gas is bubbled into the de-ionized water within container 21. For example, FIG. 2 shows a gas source 22 and a gas distribution system 23 used to bubble the de-ionized water within container 21.

In order to strip Platinum, for example, Chlorine gas ($Cl_2(g)$) and hydrochloric gas ($HCl(g)$) are bubbled into the de-ionize water within container 21. Both Chlorine gas ($Cl_2(g)$) and hydrochloric gas ($HCl(g)$) are both highly soluble in aqueous solution. The resulting chemical reaction is given in Equation 3 below:

$$HCl(g) \rightarrow HCl(aq)$$
$$Cl_2(g) \rightarrow Cl_2(ag)$$
$$Cl_2(ag) \leftarrow \rightarrow H^+ + Cl^- + HOX \qquad \text{Equation 3}$$

As can be seen from Equation 3, Chlorine gas dissolved in aqueous hydrochloric acid produces free chlorine. This Chlorine will oxidize metals such as Platinum. The chemical reaction for the oxidation of Platinum is given in Equation 4 below:

$$Pt+6Cl^- \rightarrow [PtCl_6]^{2-} \qquad \text{Equation 4}$$

The amount of Chlorine gas and hydrochloric gas is dependent upon the amount of Platinum to be oxidized. This in turn is highly dependent upon, among other factors, the number and size of the wafers being processed, and the thickness of the layer of Platinum to be oxidized.

In a step 15, after the Platinum has been oxidized, the solution within container 21 is diluted, for example, by overflowing container 21, for example with de-ionized water or purified water.

After dilution, in a step 16, wafer cassette 24 is removed from container 21. The use of Chlorine gas and hydrochloric gas to perform the metal etch allows for tighter control of the chemical composition of the bath resulting in lower chemical costs.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for stripping metal from a wafer comprising the following steps:

(a) submerging the wafer in de-ionized water; and, (b) bubbling chlorine gas and hydrochloric acid gas into the de-ionized water.

2. A method as in claim 1 wherein in step (a) the de-ionized water is held within a container made of quartz.

3. A method as in claim 1 wherein in step (a) the wafer is within a cassette of wafers.

4. A method as in claim 1 wherein in step (a) includes the following substep:

(a.1) heating the de-ionized water.

5. A method as in claim 1 additionally comprising the following step:

(c) diluting the de-ionized water; and (d) removing the wafer from the diluted de-ionized water.

6. A method as in claim 1 wherein the metal is Platinum.

7. A method for stripping metal from a surface on which is being processed an integrated circuit, the method comprising the steps of comprising the following steps:

(a) submerging the surface in de-ionized water; and, (b) bubbling chlorine gas and hydrochloric acid gas into the de-ionized water.

8. A method as in claim 7 wherein in step (a) the de-ionized water is held within a container made of quartz.

9. A method as in claim 7 wherein in step (a) the surface is on a wafer placed within a cassette of wafers.

10. A method as in claim 7 wherein in step (a) includes the following substep:

(a.1) heating the de-ionized water.

11. A method as in claim 7 additionally comprising the following step:

(c) diluting the de-ionized water; and (d) removing the surface from the diluted de-ionized water.

12. A method as in claim 7 wherein the metal is Platinum.

* * * * *